(12) United States Patent
Koopmans

(10) Patent No.: US 6,911,624 B2
(45) Date of Patent: Jun. 28, 2005

(54) COMPONENT INSTALLATION, REMOVAL, AND REPLACEMENT APPARATUS AND METHOD

(75) Inventor: Michel Koopmans, Boise, ID (US)

(73) Assignee: Micron Technology, Inc., Boise, ID (US)

(*) Notice: Subject to any disclaimer, the term of this patent is extended or adjusted under 35 U.S.C. 154(b) by 24 days.

(21) Appl. No.: 10/226,896

(22) Filed: Aug. 23, 2002

(65) Prior Publication Data
US 2004/0035840 A1 Feb. 26, 2004

(51) Int. Cl.⁷ .............................. H05B 3/00; B23K 1/08
(52) U.S. Cl. .................. 219/209; 228/180.21; 219/543
(58) Field of Search ................. 219/209, 480, 219/543; 228/180.21, 180.22, 264, 180.1; 338/306–309

(56) References Cited

U.S. PATENT DOCUMENTS

| | | | |
|---|---|---|---|
| 3,289,046 A | * 11/1966 | Carr ........................... 361/760 |
| 4,374,316 A | 2/1983 | Inamori et al. |
| 4,426,571 A | 1/1984 | Beck |
| 4,582,975 A | 4/1986 | Daughton |
| 4,769,525 A | 9/1988 | Leatham |
| 4,799,617 A | 1/1989 | Friedman |
| 4,899,180 A | 2/1990 | Elhatem et al. |
| 5,010,233 A | 4/1991 | Henschen et al. |
| 5,175,409 A | 12/1992 | Kent |
| 5,645,123 A | * 7/1997 | Doi et al. ..................... 219/209 |
| 5,700,987 A | * 12/1997 | Basavanhally ............... 361/760 |
| 5,859,407 A | * 1/1999 | Saiki et al. ................... 219/209 |
| 5,951,893 A | * 9/1999 | Bitko et al. ................... 219/209 |
| 5,994,766 A | 11/1999 | Shenoy et al. |
| 6,031,729 A | * 2/2000 | Berkely et al. .............. 219/209 |
| 6,048,753 A | 4/2000 | Farnworth et al. |
| 6,121,576 A | * 9/2000 | Hembree et al. ............ 219/209 |
| 6,184,494 B1 | 2/2001 | Isokoski et al. |
| 6,339,210 B1 | 1/2002 | Hembree et al. |
| 6,396,706 B1 | * 5/2002 | Wohlfarth ................... 219/388 |
| 6,423,939 B1 | * 7/2002 | Pan ............................ 219/209 |
| 6,696,669 B2 | * 2/2004 | Hembree et al. ........... 219/209 |
| 2002/0038797 A1 | * 4/2002 | Friedrich et al. ........... 219/209 |
| 2002/0162829 A1 | * 11/2002 | Weber et al. ............... 219/209 |

FOREIGN PATENT DOCUMENTS

| | | | |
|---|---|---|---|
| DE | 19703212 | * | 7/1998 |
| GB | 2345453 | * | 7/2000 |
| JP | 64-73633 | * | 3/1989 |
| JP | 2001-113363 | * | 4/2001 |

OTHER PUBLICATIONS

Benson, A. et al, "Design and Characterization of Microscale Heater Structures for Test Die and Sensor Applications," 1998 Intersoc. Conf. on Thermal Phenomena, p 434–41, 1998.*

Palfi, T.L., et al., "Selective Electrical Heater System for Module Removal," IBM Tech. Discl. Bull., vol. 9, No. 11, Apr. 1967.*

* cited by examiner

Primary Examiner—John A. Jeffery
(74) Attorney, Agent, or Firm—TraskBritt

(57) ABSTRACT

An apparatus and method for attaching a flip chip configured semiconductor die to a substrate as well as removing the die and replacing it on the substrate with another flip chip-configured semiconductor die by way of an electrically resistive thermal supply circuit that provides heat to soften or melt an electrical connection material of discrete conductive elements connecting the two components, as well as providing heat to release a dielectric underfill material, if present. Methods for designing a thermal supply circuit and are also disclosed. Semiconductor die and substrate configurations incorporating thermal supply circuits as well as thermal supply circuit configurations and design approaches are also disclosed.

56 Claims, 8 Drawing Sheets

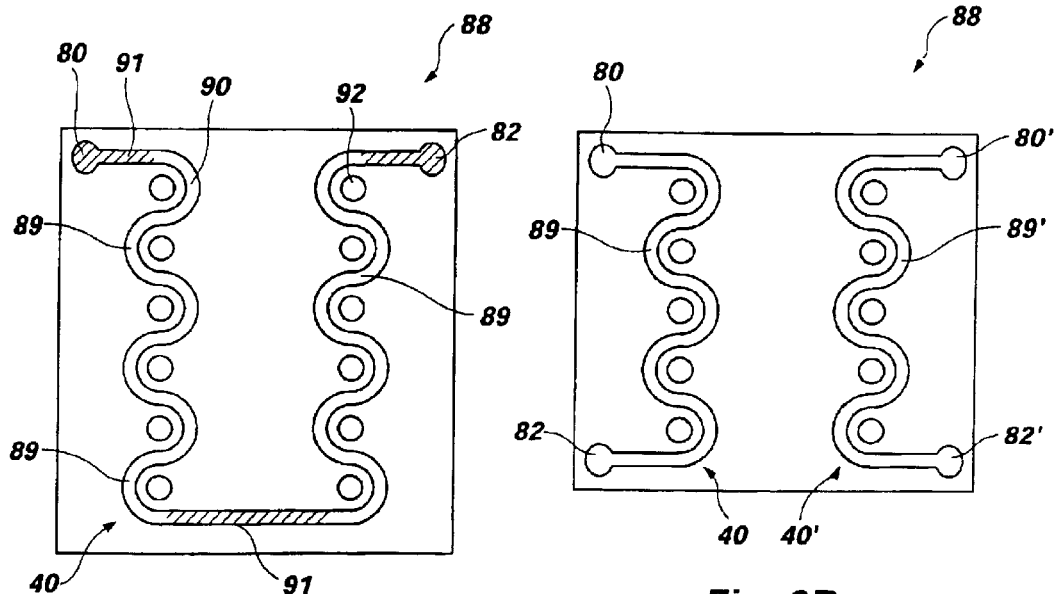
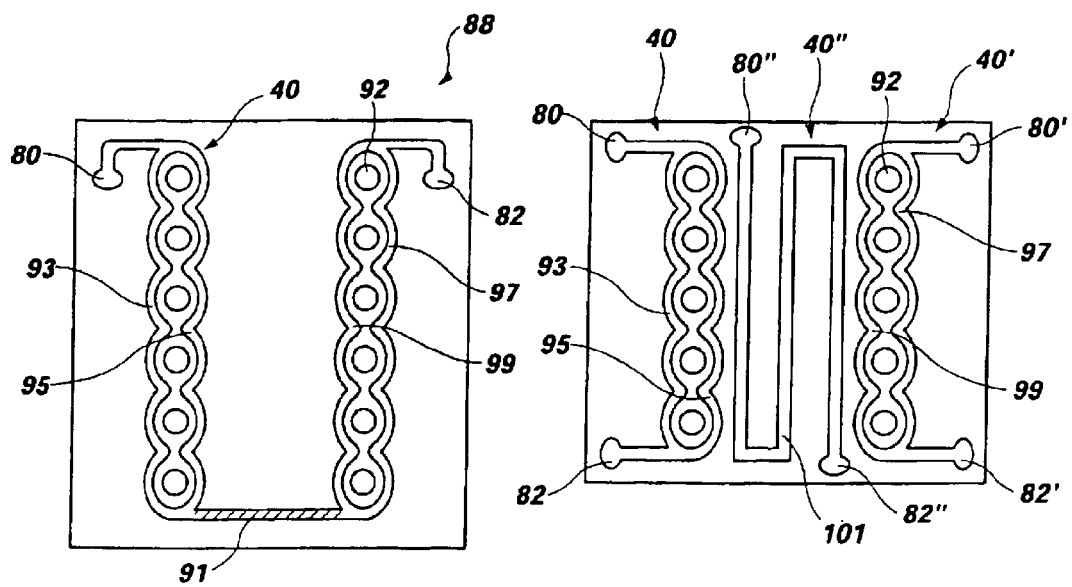

COMPONENT INSTALLATION, REMOVAL, AND REPLACEMENT APPARATUS AND METHOD

BACKGROUND OF THE INVENTION

1. Field of the Invention

The present invention relates generally to a process for attaching and removing a flip chip configured or other conductively bumped semiconductor die by way of an electrically resistive thermal supply circuit used to provide heat to melt an electrical connection material forming bonds between the semiconductor die and a substrate. Also, the invention relates to forming modules having a plurality of semiconductor dice, commonly referred to as multi-chip modules (MCMs), wherein at least one semiconductor die is flip chip configured or otherwise conductively bumped so that mechanical and electrical bonds with a carrier substrate may be created or eliminated by way of a thermal supply circuit that supplies heat either directly or indirectly to a solder ball, solder paste, electrically conductive or conductor-filled thermoplastic, or other suitable electrical connection material.

2. State of the Art

In conventional semiconductor device fabrication processes, a number of distinct semiconductor devices, such as memory chips or microprocessors, are fabricated on a semiconductor substrate, such as a silicon wafer or other bulk semiconductor substrate. After fabrication, the devices are typically singulated to separate the individual semiconductor devices from one another. In addition, various post-fabrication processes, such as testing and burn-in processes, may be employed either prior to or following singulation of the semiconductor dice. Further, the individual semiconductor devices, commonly termed "bare dice", may be packaged in one of a number of configurations. Along with the trend in the semiconductor industry to decrease semiconductor device size and increase the density of structures of semiconductor devices, package sizes are also ever-decreasing. One type of semiconductor device package, the so-called "chip-scale package" or "chip-sized package" ("CSP"), consumes about the same amount of area or "real estate" upon a carrier substrate, such as a circuit board to which the CSP is mounted, as the bare semiconductor die itself. Such chip-scale packages may include an interposer substrate having roughly the same surface area as the semiconductor device and used to redistribute input/output or "I/O" connections from the semiconductor die to a configuration more suitable for connection to higher-level packaging.

A particular type of CSP and substrate connection, commonly referred to as a flip chip, has enjoyed some success. A chip having conductive bumps of, for example, solder arranged on the active surface thereof is aligned to the carrier substrate with the conductive bumps in contact with terminal pads of the carrier substrate, and all connections are made simultaneously by heating and reflowing the solder. It is also known to employ conductive bumps of a conductive or conductor-filled polymer or epoxy in lieu of solder bumps.

Although the flip chip has been a popular configuration for semiconductor devices, the densification of die and substrate interconnections, as well as technological advances in the art, have decreased the overall size of the semiconductor die (for a given circuit density) and, thus, requires constant redesign, reduces bond pad size and pitch (spacing) and may also result in die-to-carrier substrate compatibility issues. Further, due to ongoing advances in circuit component design and fabrication technology, a given die may be "shrunk" one or more times during its commercial lifespan to enhance per-wafer yield, device speed and performance, and quality, such "shrinks" often resulting in bond pad relocation. Consequently, the need to enable varying sized semiconductor dice and/or changing bond pad arrangements to be compatible with a given substrate has been recognized.

In response, flip chip integrated circuit (IC) designs may employ a redistribution layer to enable varying sized semiconductor dice and/or changing bond pad arrangements to be compatible with a terminal pad arrangement of a given substrate. The redistribution layer is a layer that is formed over an active surface of a flip chip IC to enable electrical interconnection to a particular package via solder or other conductive bumps. The redistribution layer includes a number of conductive traces that connect a plurality of bond pads on the active surface to rerouted locations of each of the solder or other conductive bumps arranged in an array format, usually more widely pitched. Therefore, redistribution layers may be modified as a part of the semiconductor die fabrication process at the wafer level to enable changing semiconductor die bond pad configurations to be electrically connected to a given substrate, including installation within a MCM. Likewise, redistribution layers may be used to adapt a given semiconductor die bond pad arrangement to different terminal pad arrangements of different carrier substrates. MCM configurations, such as random access memory modules used in personal computers, are commonly formed with multiple memory chips on a single substrate, such as single-in-line memory modules (SIMMs), dual in-line modules (DIMMs), triple in-line memory modules (TRIMMs) and Rambus in-line memory modules (RIMMs).

Once a conductively bumped semiconductor die, including those using a redistribution layer, is connected to a carrier substrate such as an MCM, it becomes difficult to remove or replace the semiconductor die as the electrical connections between the semiconductor die and the carrier substrate are hidden from view and inaccessible. Consequently, replacement methods and apparatus have been developed for replacing a defective component installed upon a carrier substrate such as a printed circuit board ("PCB"). One method used to replace a conductively bumped semiconductor die is to simply mechanically mill the component from the carrier substrate.

A method used to remove electrical components soldered to a carrier substrate is to heat the carrier substrate in an oven to the reflow temperature of the solder of the conductive bumps. Yet another method to remove soldered components is to locally heat the component to reflow temperature using hot air in order to remove it from the carrier substrate. Examples of convection-type heating devices used to remove components soldered to a carrier substrate are disclosed in U.S. Pat. No. 4,426,571 and U.S. Pat. No. 4,799,617. However, hot air flow is difficult to precisely direct and isolate, may cause overheating of semiconductor devices and structures adjacent to the semiconductor devices that are intended to be removed and, due to the large volume and flow of sufficiently hot air that is required to replace a semiconductor device, may also damage the PCB.

In an attempt to eliminate the problems associated with heating semiconductor dice in an oven or utilizing the convection-type rework devices, in some instances heaters have been embedded in or carried by printed circuit boards for use in the soldering of an electronic component to a circuit substrate and in attachment/disassembly operations. Such arrangements are shown in U.S. Pat. No. 5,010,233 and U.S. Pat. No. 5,175,409.

U.S. Pat. No. 6,339,210 to Hembree et al., assigned to the assignee of the present invention, describes a system for back bonding a semiconductor die to and removing the semiconductor die from, a die pad of a lead frame by way of a heat-activated adhesive that is cured by an imbedded heating circuit on the die pad. However, Hembree discloses attaching a die cover to the die pad, and does not disclose apparatus for installing, removing, and replacing a semiconductor die using a flip chip connection approach.

Accordingly, it would be advantageous to develop apparatuses and methods for removing and installing a flip chip configured or otherwise conductively bumped semiconductor die on a substrate that improves on the state of the art and eliminates some of the disadvantages thereof. Particularly, it would be advantageous to enable removal of individual components of a module comprising a plurality of individual semiconductor devices such as a memory module, by way of heating elements that melt or soften an electrically conductive material used in conductive bumps. In addition, it would be advantageous to enable individual semiconductor devices employing a flip chip or otherwise conductively bumped semiconductor die or semiconductor dice to be removed or installed by way a thermal supply circuit carried by either the semiconductor die or the substrate with which it is associated.

BRIEF SUMMARY OF THE INVENTION

The present invention includes apparatus and methods for forming semiconductor die packages, assemblies, and modules from flip chip or other conductively bumped semiconductor dice having wherein an electrically resistive heating circuit is employed to effectuate making or breaking conductively bumped electrical connections between the conductively bumped electrical contact areas of the semiconductor die and a carrier substrate.

In one embodiment, the electrically resistive heating circuit resides on or within a redistribution layer of a semiconductor die. In this embodiment, solder paste, preformed solder balls, or other electrical connection material in the form of discrete conductive elements (also termed "conductive bumps" herein), such as conductive or conductor-filled thermoplastic, may be applied to or formed on the carrier substrate or semiconductor die and reflowed or softened to make the electrical connections therebetween. As used herein, the terms "carrier substrate" and "substrate" include, without limitation, interposer substrates, carrier substrates in the form of printed circuit or wiring boards, module boards and motherboards, as well as any other higher-level packaging to which a flip chip or other conductively bumped semiconductor die may be electrically connected. Subsequently, in order to remove the semiconductor die from the carrier substrate, the electrically resistive heating circuit may be energized so that the electrical connection material melts and the semiconductor die removed. Furthermore, in order to install a replacement semiconductor die in place of the removed semiconductor die, the electrically resistive heating circuit may again be employed, as the location for the replacement semiconductor die may be damaged by a conventional reflow process or a conventional reflow process is unavailable or otherwise undesirable. In another embodiment, an electrically resistive heating circuit may be energized by making electrical contact between an electrical source and an electrically accessible peripheral side or top surface of the semiconductor die. In order to remove the semiconductor die from the carrier substrate after electrical connection thereto, the electrically resistive heating circuit on the redistribution layer of the semiconductor die may be energized by the electrically accessible peripheral or top surface.

In a further embodiment, to install a die having a heating circuit onto a carrier substrate, an electrical trace on the carrier substrate may be energized by way of substrate terminal pads, wherein the semiconductor die and carrier substrate are matingly engaged to electrically connect the electrical source to the electrically resistive heating circuit on the semiconductor die. Subsequently, in order to remove the semiconductor die from the carrier substrate, electrical connections that were created by heating the discrete conductive elements disposed between the semiconductor die and carrier substrate may be used to energize the electrically resistive heating circuit on the redistribution layer of the die and thereby detach the semiconductor die from the carrier substrate upon melting or softening of the discrete conductive elements. The discrete conductive elements may comprise solder, conductive or conductor-filled thermoplastic, or other conductive material that may be melted or softened for connection or detachment via heating. A discrete conductive element having a first melting point may be used to electrically connect an electrical source to the electrically resistive heating circuit on the semiconductor die while a discrete conductive element having a second melting point may be used to electrically connect the bond pads of the semiconductor die to the carrier substrate terminal pads.

Alternatively, the electrically resistive heating circuits may be located on or in a carrier substrate in order to provide heat to discrete conductive elements in order to create or eliminate electrical connections between the semiconductor die and the carrier substrate. Connection pads electrically connected to the electrically resistive heating circuit located on the carrier substrate may be selectively electrically connected to an electrical source, thereby heating the discrete conductive elements in order to attach or detach a semiconductor die to the carrier substrate.

An electrically resistive heating circuit located either on the semiconductor die or on the carrier substrate may be at least partially covered by or fully encapsulated within, a dielectric layer. Such a dielectric layer may provide protection for an electrically resistive heating circuit during subsequent processing and use. Further, the protective dielectric layer may prevent unwanted electrical connections from being formed with the electrically resistive heating circuit. Moreover, electrically resistive heating circuits may comprise high resistance regions that produce appreciable heat when energized and lower resistance conductive regions that do not produce appreciative heat when energized. Such conductive regions may be formed in part from a redistribution layer or other conductive layer, and may extend onto a peripheral or top surface of the semiconductor die.

In another embodiment, electrically resistive heating circuits exist on a carrier substrate as well as on a semiconductor die and each circuit may be used either alone or in any combination to effect either installation or removal of the discrete conductive elements to or from the carrier substrate, respectively. In any embodiment of the present invention, a low-viscosity dielectric underfill may be disposed between the semiconductor die and carrier substrate by flowing into the space or gap between the semiconductor die and the carrier substrate provided by the standoff of the discrete conductive elements. The dielectric underfill may be introduced and flowed throughout the array of discrete conductive elements by capillary action, without the assistance of either positive or negative pressure, for simplicity, although other approaches may be used as known in the art. The dielectric underfill may be flowed until the underfill between the semiconductor die and carrier substrate is complete, the underfill structure providing environmental protection for the array as well as enhanced support and mechanical securement for the semiconductor die after it is electrically (and mechanically) bonded to the substrate through the discrete conductive elements. Moreover, the dielectric underfill is compatible with the use of an electrically resistive heating circuit to attach or detach a dielectric die to or from a carrier substrate, respectively. More particularly, during removal of a previously attached dielectric die from a carrier substrate wherein a dielectric underfill has been used, the dielectric underfill may be formulated to soften or melt or otherwise degrade and thus be releasable as between the semiconductor die and carrier substrate under generally the same conditions that the discrete conductive elements of the semiconductor die may be detached from the carrier substrate terminal pads. The dielectric underfill may also be formulated to melt or soften and release at a slightly higher temperature than the discrete conductive elements to ensure that the electrical connection elements are sufficiently heated to allow for removal of the semiconductor die from the carrier substrate.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention and in which similar elements and features in different figures are identified by the same or similar reference numerals:

FIGS. 3A–3D are top views of a die or substrate surface having connection and bond or terminal pads as well as a electrically resistive heating circuit located thereon;

DETAILED DESCRIPTION OF THE INVENTION

Figure 1A:
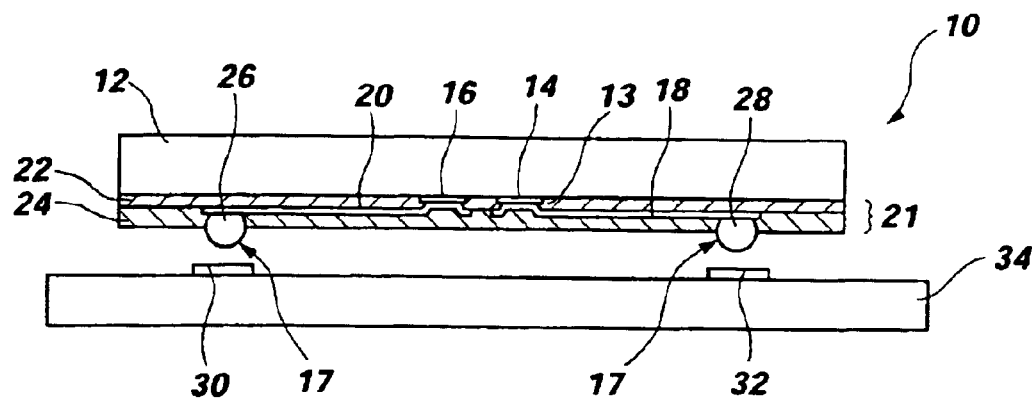
FIG. 1A is a side cross-sectional view of a flip chip configured semiconductor die having a redistribution layer and an associated substrate.
Figure 2:
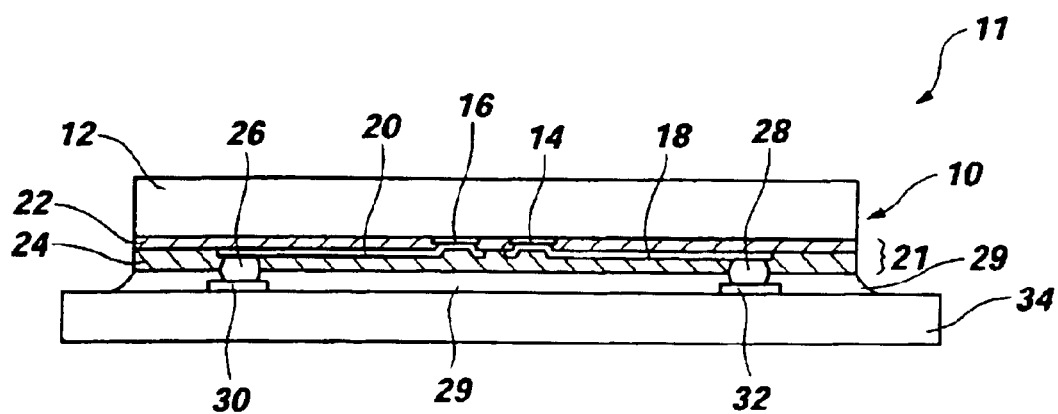
FIG. 2 is a side cross-sectional view of a semiconductor die attached to a substrate.

FIG. 1A shows a flip chip 10 comprising semiconductor die 12 including an redistribution layer 21 comprising a dielectric layer 22, conductive redistribution layer traces 18 and 20, and a second dielectric layer 24. Conductive redistribution layer traces 18 and 20 electrically connect die bond pads 14 and 16 to discrete conductive elements 28 and 26, respectively. It will be understood that discrete conductive elements 26 and 28 comprise only part of an array of discrete conductive elements disposed between flip chip 10 and substrate 34. Substrate 34 includes substrate terminal pads 30 and 32 that are located to attach to discrete conductive elements 26 and 28, respectively. FIG. 2 shows a flip chip assembly 11, wherein the flip chip 10 shown in FIG. 1A has been attached to substrate 34. More specifically, die bond pad 14 is electrically connected to substrate terminal pad 32, while die bond pad 16 is electrically connected to substrate terminal pad 30. Such electrical connections may be made by reflowing the discrete conductive elements 26 and 28 by passing assembled flip chip 10 and substrate 34 through a reflow oven, as known in the art. Discrete conductive elements 26 and 28 may comprise, for example, 1 mm×1 mm bricks of solder paste which, upon reflow, form 400 μm solder balls. Alternatively, masses of solder paste may be screen-printed and then reflowed, or preformed solder balls placed and then at least partially reflowed. In addition, after reflow, a dielectric underfill 29 as shown in FIG. 2 may be employed to fill throughout the array of discrete conductive elements by capillary action.

Figure 1B:
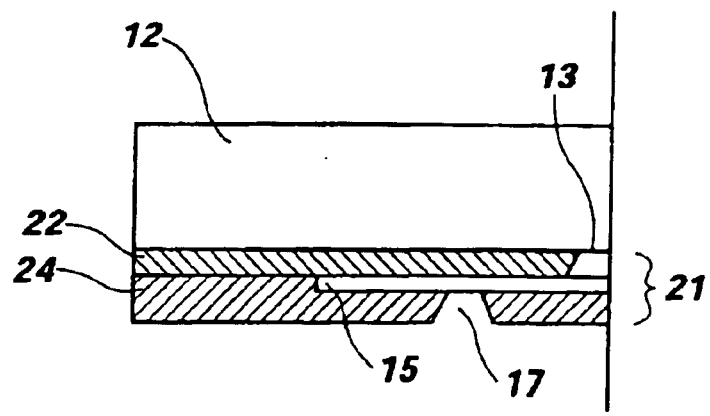
FIG. 1B is an enlarged, partial side cross-sectional view of a semiconductor die, illustrating the material layers which may comprise a redistribution layer.

FIG. 1B shows an enlarged schematic view of a semiconductor die 12 and a redistribution layer 21 thereon. Redistribution layer 21 comprises a dielectric layer 22 formed onto the semiconductor die 12, followed by a conductive layer 15 formed upon the dielectric layer 22, and then a second dielectric layer 24 formed upon conductive layer 15. The dielectric layers may comprise one or more layers of a dielectric material, such as a polyimide, silicon dioxide, silicon nitride, borosilicate glass (BSG), phosphosilicate glass, borophosphosilicate glass (BPSG) or even a solder resist, applied in wet or dry film form. Conductive layer 15 may comprise aluminum, nickel, copper, or other conductive material. Apertures 13 may be formed through dielectric layer 22 by way of etching or as otherwise known in the art to enable connection of conductive traces such as 18 and 20 of conductive layer 15 to die bond pads such as 14 and 16. Apertures 17 may be formed through dielectric layer 24 to enable electrical connection of conductive traces such as 18 and 20 otherwise covered by dielectric layer 24 to discrete conductive elements 26 and 28 (shown in FIG. 1A). Conductive layer 15 is typically comprised of a plurality of traces, each trace extending from a bond pad on a semiconductor die active surface to an aperture 17 defining the location of a rerouted connection as formed through dielectric layer 24, as illustrated by conductive redistribution layer traces 18 and 20 in FIGS. 1A and 2. Conventionally, the traces of conductive layer 15 may comprise aluminum, upon which a layer of nickel and then gold is deposited to form so-called "under bump metallization" readily wettable by solder comprising the discrete conductive elements or bumps.

FIGS. 3A–3D illustrate different exemplary embodiments of electrically resistive heating circuits of the present invention. As shown in the following figures, heating circuits may be located on the surface of the redistribution layer, on the surface of the substrate, or even extending onto a peripheral or top surface of a flip chip configured semiconductor die. Therefore, in FIGS. 3A-3D, a generic die/substrate surface 88 is shown having at least one electrically resistive heating circuit thereon. Surface 88 may comprise a substrate surface or a flip chip active surface, but many alternatives are possible.

FIG. 3A shows an electrically resistive heating circuit 40 comprising connection pads 80 and 82, substantially nonheat-generating low resistance regions 91, and high-resistivity heating regions 89 weaving about pads 92. Pads 92 may be substrate terminal pads or rerouted bond pad connection areas of a redistribution layer and may be configured with discrete conductive elements (not shown). Substantially non-heat generating low resistance regions 91 may be located to minimize unnecessary heating of the substrate or flip chip. Moreover, low resistance regions 91 may comprise a portion of the redistribution layer on a flip chip, or may comprise a separate conductive layer in electrical contact with the electrically resistive heating circuit 40. High resistivity heating regions 89 are positioned generally proximate to pads 92. Thus, heating may be concentrated around the discrete conductive element bond locations of a semiconductor die and/or substrate surface 88.

FIG. 3B illustrates a semiconductor die and/or substrate surface 88 wherein individual electrically resistive heating circuits 40 and 40' are located. In this embodiment, the circuits 40 and 40' as well as connection pads 80, 82, 80', and 82' comprise high-resistivity heating regions 89 and 89'.

FIG. 3C illustrates another embodiment of a semiconductor die and/or substrate surface 88 having an electrically resistive heating circuit 40 located thereon. Electrically resistive heating circuit 40 comprises connection pads 80 and 82, resistive heating regions 93 and 95 located proximate to a first plurality of pads 92, a substantially non-heat generating low resistance region 91, and higher-resistivity heating regions 97 and 99 located proximate to a second plurality of pads 92. A resistive region that is configured to minimize its heat generation may be used in place of a low resistance region if desired. Moreover, the heating regions of an electrically resistive heating circuit may be configured, as with a heat sink, to store a certain amount of heat. Doing so may allow the electrically resistive heating circuit to be energized, store the amount of heat necessary to make the electrical connections, and then the heating circuit may be de-energized and the electrical connection elements melted or softened so as to form or eliminate electrical connections between the semiconductor die and the substrate. In general, the electrically resistive heating circuit may be designed to tailor its thermal response, such as heat distribution or heat up time during operation.

FIG. 3D shows a semiconductor die and/or substrate surface embodiment having electrically resistive heating circuits 40, 40', and 40". Electrically resistive heating circuit 40 is configured with connection pads 80 and 82 for energizing the circuit and electrically resistive heating regions 93 and 95 proximate to a first plurality of pads 92. Electrically resistive heating circuit 40' is configured with connection pads 80' and 82' for energizing the circuit and higher-resistivity heating regions 97 and 99 proximate to a second plurality of pads 92. Electrically resistive heating circuit 40" is configured with connection pads 80" and 82" as well as electrically resistive region 101. Electrically resistive region 101 may be useful in providing necessary heating to release a dielectric underfill disposed between a flip chip and a substrate.

Of course, many other embodiments are contemplated by the present invention, as electrical circuits may be designed to accommodate bond and terminal pad design and placement. Although the present invention has been depicted generally by a semiconductor die having centrally located bond pads being rerouted using a redistribution layer, the present invention is not so limited and contemplates any conductively bumped bond pad arrangement. Examples of other configurations include, without limitation, a flip chip configured semiconductor device which is bumped without rerouting and a semiconductor die wire bonded or TAB bonded to a bumped interposer substrate (wherein the electrically resistive heating circuit may be carried on or within the interposer substrate). Similarly, a conductively bumped die may be connected to an interposer substrate which is, itself, conductively bumped and carries an electrically resistive heating circuit.

Figure 4:
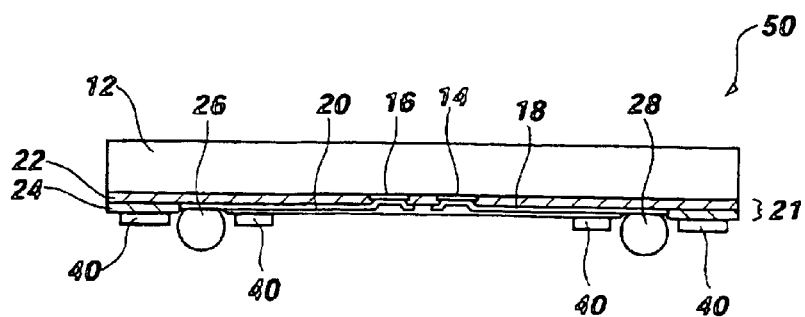
FIG. 4 is a side cross-sectional view of a semiconductor die of the present invention wherein an electrically resistive heating circuit is located on the redistribution layer of the semiconductor die.

Turning to FIG. 4, an exemplary flip chip 50 of the present invention is shown, wherein an electrically resistive heating circuit 40 is located on redistribution layer 21 of semiconductor die 12. Electrically resistive heating circuit 40 may comprise any electrically resistive material that generates the necessary heat to cause discrete conductive elements 26 and 28 to form an electrical bond with a substrate terminal pad (not shown). Electrically resistive heating circuit 40 may be fabricated from, by way of example only, copper, nickel, nichrome, tungsten, titanium, vanadium or any other material that generates the requisite resistive heat energy to melt or soften electrical connection elements 26 and 28 and is suitable for use with conventional semiconductor fabrication deposition processes. The material of electrically resistive heating circuit 40 may be applied (for example) by sputtering, CVD, or plasma enhanced CVD, followed by etching to define electrically resistive heating circuit 40, or applied in a desired configuration via screen or stencil printing or other methods well known in the art. Further, electrically resistive heating circuit 40 may comprise any desired shape or size, and may be comprised of regions of substantially higher resistance that supply heat and low resistance regions which are merely electrical conductors furnishing power to the high-resistance regions. FIG. 3A shows an example of an electrically resistive heating circuit configuration on a component surface 88 (such as a surface of either a semiconductor die or substrate) in which heating circuit 90 is comprised of high-resistivity heat generating regions 89 as well as substantially non heat-generating low resistance regions 91, which do not generate appreciable heat when energized. As such, high-resistivity heating regions 89 and substantially non heat-generating regions 91 can be selectively tailored to provide heat to the bond pads 92 of the surface 88.

Figure 5:
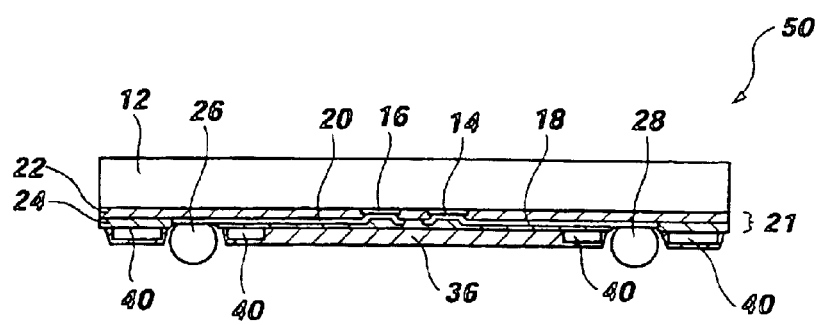
FIG. 5 is a side cross-sectional view of a semiconductor die of the present invention wherein an electrically resistive heating circuit is located on the redistribution layer of the die and a dielectric layer substantially covering the electrically resistive heating circuit

FIG. 5 shows the flip chip of FIG. 3 including a dielectric layer 36 for protecting the electrically resistive heating circuit 40. Thus dielectric layer 36 substantially covers electrically resistive heating circuit 40, except that an electrical connection to electrically resistive heating circuit 40 must be left free from dielectric in at least a portion of electrically resistive heating circuit 40 in order to electrically contact and energize the circuit. In this way, dielectric layer 36 may prevent inadvertent shorting to discrete conductive elements 26 and 28 or other unwanted electrical connections from being formed with the electrically resistive heating circuit 40. The dielectric layer 36 may be of any material known in the art, including those previously discussed with respect to dielectric layers 22 and 24.

Figure 6:
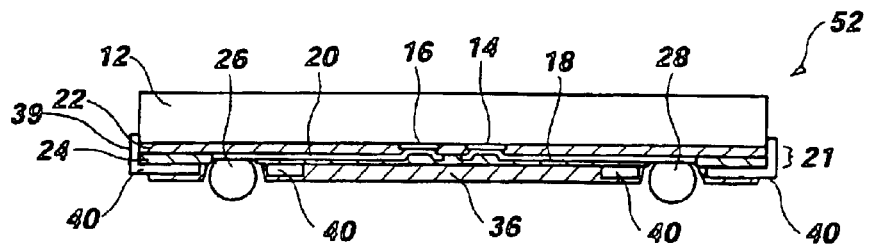
FIG. 6 is a side cross-sectional view of a die of the present invention wherein an electrically resistive heating circuit is located on the redistribution layer of the semiconductor die and extends to a peripheral surface of the semiconductor die and may be energized therethrough, the semiconductor die also having a dielectric layer at least partially covering the electrically resistive heating circuit.

FIG. 6 shows another embodiment of an exemplary flip chip 52 of the present invention. Flip chip 52 includes semiconductor die 12 with a redistribution layer and also an electrically resistive heating circuit 40 that extends at least partially onto a peripheral surface 39 of the flip chip 52. This enables an electrical connection to be made on a peripheral surface 39 of the flip chip 52 in order to energize the electrically resistive heating circuit 40, and thereby attach or detach the semiconductor die 12 to a substrate (not shown).

Figure 7B:
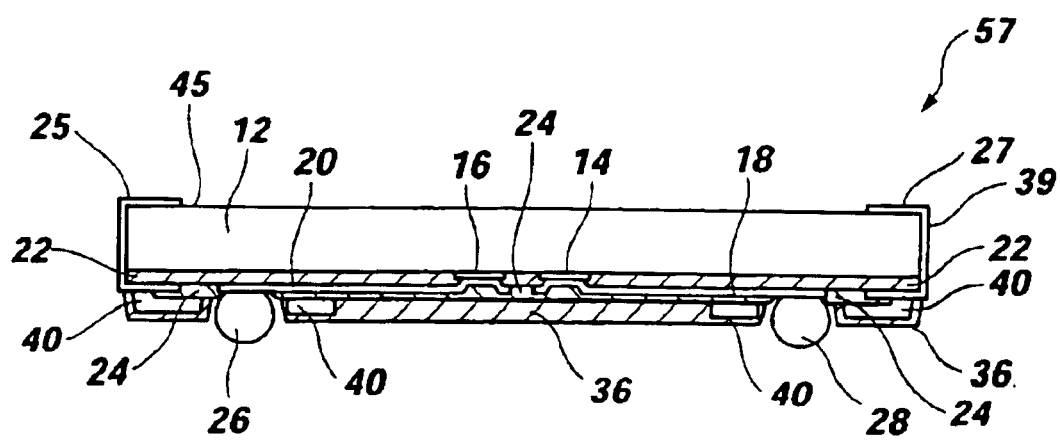
FIG. 7B is a side cross-sectional view of a semiconductor die of the present invention wherein an electrically resistive heating circuit is located on the redistribution layer, and wherein a conductive trace of the redistribution layer is connected to the electrically resistive heating circuit and extends to a peripheral and top surface of the semiconductor die and may be energized therethrough, a dielectric layer at least partially covering the electrically resistive heating circuit.
Figure 7A:
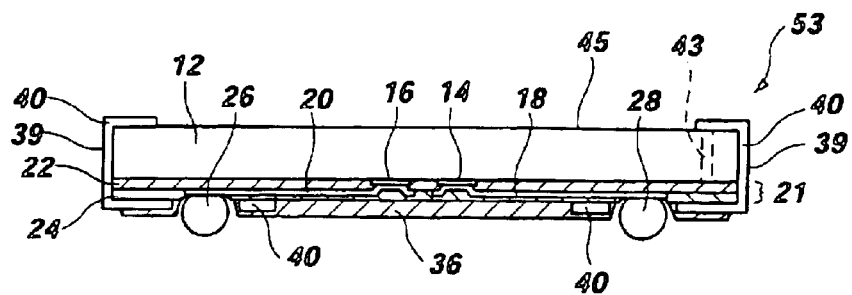
FIG. 7A is a side cross-sectional view of a die of the present invention wherein an electrically resistive heating circuit is located on the redistribution layer of the semiconductor die and extends to a peripheral and top surface of the semiconductor die and may be energized therethrough, the semiconductor die also having a dielectric layer at least partially covering the electrically resistive heating circuit.

FIG. 7A shows another embodiment of an exemplary flip chip 53 of the present invention. Flip chip 53 includes semiconductor die 12 with a redistribution layer 21 and also having an electrically resistive heating circuit 40 that extends over a peripheral surface 39 and onto top surface 45 of the flip chip 53. This allows for an electrical connection to be made on a peripheral surface 39 or top surface 45 of the flip chip 53 in order to energize the electrically resistive heating circuit 40, and thereby attach or detach the flip chip 53 to or from, respectively, a substrate (not shown). Such an embodiment may be particularly advantageous when a flip chip is assembled into a MCM, wherein there is not sufficient space to access terminal or connection pads on the substrate in order to energize the electrically resistive heating circuit 40. Likewise, it may be advantageous to configure the flip chip with conductive vias 43 as shown in broken lines that extend through the body of the chip and are connected to an electrically resistive heating circuit 40 to enable the electrically resistive heating circuit 40 to be energized by way of a top surface 45.

FIG. 7B shows an alternative embodiment of a flip chip 57 having a side or top surface electrical connection surface for energizing the electrically resistive heating circuit 40. Conductive traces 25 and 27 of the redistribution layer 21 extend to a peripheral surface 39 and top surface 45 and also connect to the electrically resistive heating circuit 40. This configuration may be advantageous since the relatively low resistivity conductive traces 25 and 27 would not generate appreciable heat when energized, similar to non-heat generating regions 91 in FIGS. 3A-3D. Thus, heating via the electrically resistive heating circuit 40 may be tailored and its accessibility enhanced by way of conductive traces fabricated as part of the redistribution layer 21 onto a peripheral surface 39 and/or top surface 45 of the semiconductor die 12.

Figure 8:
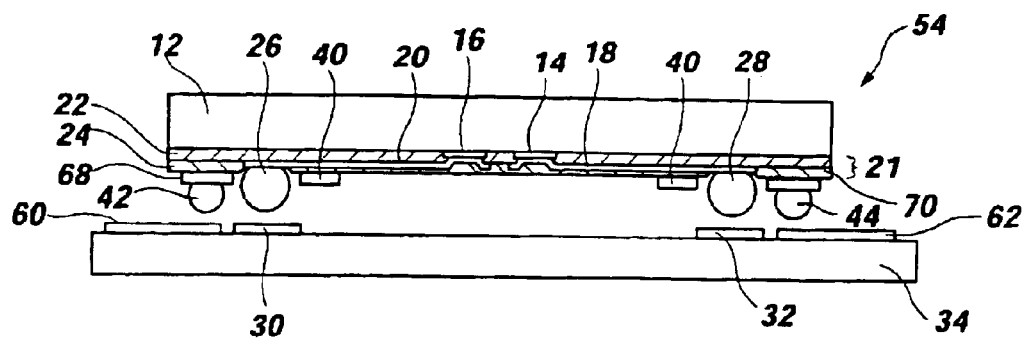
FIG. 8 is a flip chip installation schematic side cross-sectional view wherein an electrically resistive heating circuit is located on the redistribution layer of the semiconductor die and may be electrically energized via terminal pads located on the substrate.

FIG. 8 illustrates a flip chip installation schematic wherein flip chip 54 is aligned with substrate 34 for installation. Flip chip 54 includes an electrically resistive heating circuit 40 located on redistribution layer 21 of semiconductor die 12. Electrically resistive heating circuit 40 may comprise any electrically resistive material that generates the necessary heat to cause discrete conductive elements 26 and 28 to form an electrical bond with substrate terminal pads 30 and 32, respectively as well as any other terminal redistribution layer pads not shown in the figure. Electrically resistive heating circuit 40 may be energized by applying current from an electrical source to substrate connection pads 60 and 62 while connection pad 60 is in electrical contact with die connection pad 68 via electrical connection element 42, the substrate connection pad 60 being electrically connected to electrically resistive heating circuit 40, which is also electrically connected to die connection pad 70 and while in contact with substrate connection pad 62 via electrical connection element 44. Therefore, stated another way, in one example, electrical current passes through substrate connection pad 60, through electrical connection element 42, through the electrically resistive heating circuit located on the redistribution layer 21, through electrical connection element 44, and then through substrate connection pad 62. An exemplary power source may be a 24V, 6A DC power source connected to connection pads 60 and 62 using probe tips, such source also having utility for powering other embodiments of the present invention.

Establishing electrical contact between electrical connection elements 42 and 44 of the semiconductor die and substrate connection pad 60 and 62 may be accomplished by respectively engaging the discrete conductive elements 26 and 28 and electrical connection elements 42 and 44 with the substrate terminal pads and electrical connection pads 60, 62. Since each discrete conductive element and electrical connection element may have a slightly different height, a compressive force may need to be applied to hold them against their associated terminal and connection pad while energizing the electrically resistive heating circuit 40. Furthermore, measurement of the force applied may indicate that the electrical connection elements have become softened or liquified, thus relaxing and reducing the compressive force (in a compressive force system where the position is fixed to induce a force; e.g. a lead screw). Alternatively, the vertical semiconductor die position measured in order to detect the relaxation of the discrete conductive elements, thus indicating softening or melting. Additionally, a time and temperature processing recipe may be followed, without a feedback measurement mechanism to indicate softening or melting of the discrete conductive elements.

As a further feature, the melting point of electrical connection elements 42 and 44 may be different than the melting point of discrete conductive elements 26 and 28. More particularly, the melting point of electrical connection elements 42 and 44 may be higher than the melting point of discrete conductive elements 26 and 28. Thus, detecting or observing softening or melting of electrical connection elements 42 and 44 may be used as confirmation that discrete conductive elements 26 and 28 are softened or melted as well. Also, it may be advantageous to provide an observable electrical connection element specifically for indication purposes. Further, loss of conductivity through electrical connection elements 42 and 44 may be taken as an indication that conductive elements 26 and 28 have softened or melted.

Once the flip chip 54 is installed onto the substrate 34, the flip chip 54 may be removed by a similar method. Specifically, the electrically resistive heating circuit 40 is energized by way of connection pads 60 and 62, and upon melting of discrete conductive elements 26 and 28 and electrical connection elements 42 and 44, the flip chip 54 may be removed from the substrate 34, manually or by using pick-and-place equipment, as known in the art. Constant tensile force may be applied to the flip chip and substrate to effect removal of one from the other. For instance, a suction cup or vacuum quill placed on the top flip chip surface (back side of the semiconductor die) may be used to provide a tensile force in the electrical connection elements, thereby removing the flip chip upon melting of the electrical connection elements.

Figure 9:
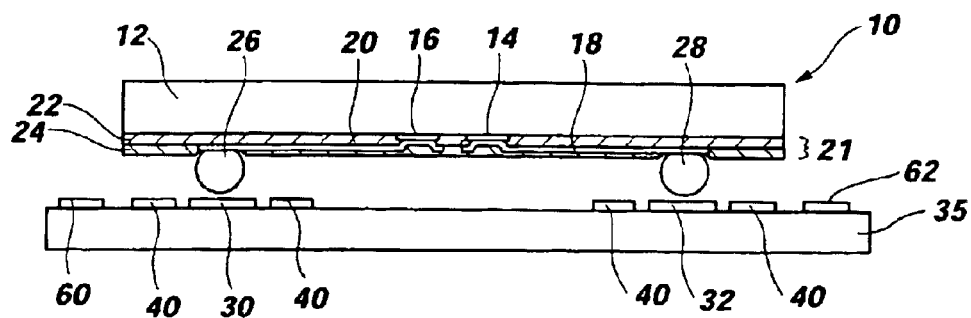
FIG. 9 is a flip chip installation schematic side cross-sectional view wherein an electrically resistive heating circuit is located on the substrate and may be electrically energized via terminal pads located on the substrate.

FIG. 9 shows another flip chip installation schematic embodiment of the present invention wherein the electrically resistive heating circuit 40 is located on the surface of the substrate 35. Flip chip 10 may be installed onto the substrate 35 by energizing electrically resistive heating circuit 40 on the substrate via connection pad/trace 60 and connection pad/trace 62, each electrically connected to electrically resistive heating circuit 40. Thus, the electrically resistive heating circuit 40 may be heated prior to contacting the discrete conductive elements 26 and 28 of the flip chip 10. Heating the terminal pads 30 and 32 of the substrate prior to contact with the discrete conductive elements 26 and 28 of the flip chip 10 may be advantageous to reduce heating of the flip chip. Moreover, as noted previously, the electrically resistive heating circuit 40 may be tailored to store a selected amount of heat energy in accordance with the amount of heat needed to melt the electrical connection elements and make the electrical connections. For instance, the electrically resistive heating circuit on the redistribution layer of a semiconductor die or on a substrate may be energized, and when sufficient heat energy is acquired the circuit may be de-energized and then the semiconductor die may be installed onto the substrate, the stored heat energy melting the electrical connection elements and thus forming electrical connections between the semiconductor die and substrate.

Figure 10:
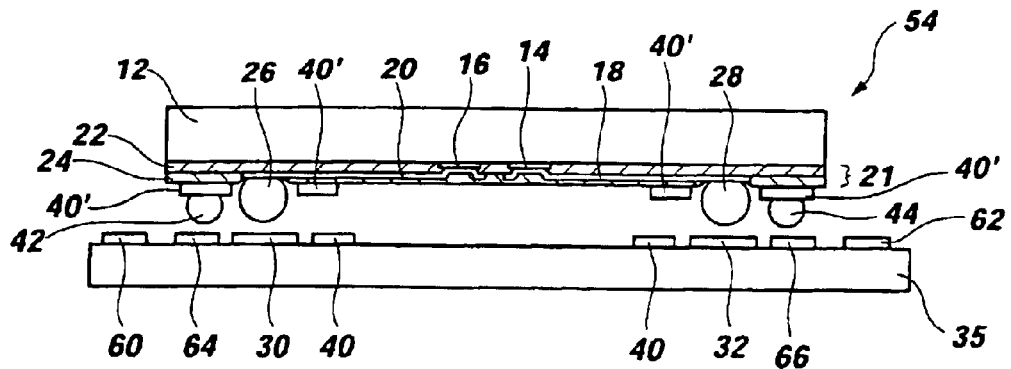
FIG. 10 is a flip chip installation schematic side cross-sectional view wherein electrically resistive heating circuit is located on the substrate and the semiconductor die and may be electrically energized via terminal pads located on the substrate.

FIG. 10 shows another flip chip installation schematic embodiment of the present invention wherein electrically resistive heating circuit 40 is located on the surface of the substrate 35 and electrically resistive heating circuit 40' is located on the flip chip 54. Electrically resistive heating circuits 40' and 40 may comprise a number of configurations and embodiments. Illustratively, heating circuits 40' and 40 may be powered separately (as separate circuits) or in combination. If powered in combination, heating circuits 40' and 40 may be powered in a series electrical configuration or in a parallel electrical configuration. Furthermore, heating circuits 40' and 40 may be tailored in heating characteristics. For instance, heating circuit 40 may be heated to a selected temperature prior to contact with any electrical connection elements of the flip chip 54. Upon contact with electrical connection elements 42 and 44 of the flip chip 54, heating circuit 40' may rapidly heat to effect electrical connection between discrete conductive elements 26 and 28 of flip chip 54 and substrate terminal pads 30 and 32. Alternatively, it may be advantageous to provide electrical connection between substrate pads 64 and 66 prior to electrical connection elements 26 and 28 contacting substrate bond pads 30 and 32, respectively to allow for a preheat of both the substrate 34 and flip chip 54 prior to attachment.

The present invention is not limited in the configuration or operation of multiple heating circuits existing on the semiconductor die and substrate, as many possibilities exist. Illustratively, a flip chip depicted in FIG. 6B may be employed in combination with the substrate depicted in FIG. 9 to achieve desired results. The heating circuits on the flip chip and the substrate may be employed for installing the flip chip, while the heating circuit on the flip chip may be used exclusively for removing the flip chip from the substrate. Further, generally, heating circuits located on the flip chip or the substrate may be energized via bond pads located on the flip chip or the substrate in any combination.

Figure 11:
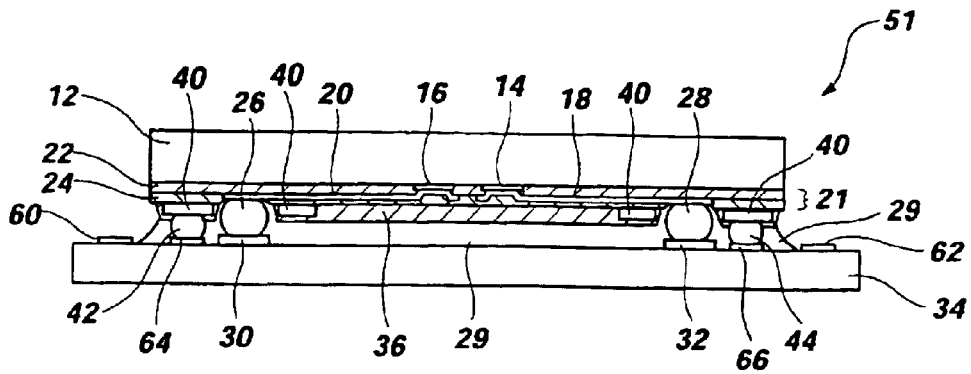
FIG. 11 is a side cross-sectional view of a flip chip assembly of the present invention having a dielectric underfill between the semiconductor die and substrate wherein the semiconductor die includes an electrically resistive heating circuit on the redistribution layer of the semiconductor die that may be energized by terminal on the substrate, the semiconductor die also having a dielectric layer that substantially covers the electrically resistive heating circuit.

FIG. 11 shows a flip chip removal schematic embodiment of the present invention wherein flip chip 51 has been attached to substrate 34 by reflow or by way of electrically resistive heating circuit 40 located on the redistribution layer 21 of flip chip 51. To remove flip chip 51 from substrate 34, electrically resistive heating circuit 40 may be employed by energizing the electrically resistive heating circuit 40 via connection pads 60 and 62. Dielectric underfill 29 may releasably respond to heating from electrically resistive heating circuit 40 by softening or melting, and discrete conductive elements 26 and 28 and electrical connection elements 42 and 44 may melt to allow the flip chip 51 to be removed from the substrate 34.

A variety of dielectric underfill materials will work for purposes of this invention, including thermoplastic materials and other suitable heat-softenable sealants. Furthermore, the electrically resistive heating circuit can also be configured or shaped to provide more heat or uniform heat to predetermined parts of the dielectric underfill material and portion of the substrate or the entire substrate through variations in the shape and size of the electrically resistive heating circuit. It is also contemplated that dielectric underfill materials which deteriorate, rather than softening or melting, under temperatures sufficient to release discrete conductive elements and electrical connection elements may be employed.

Figure 12:
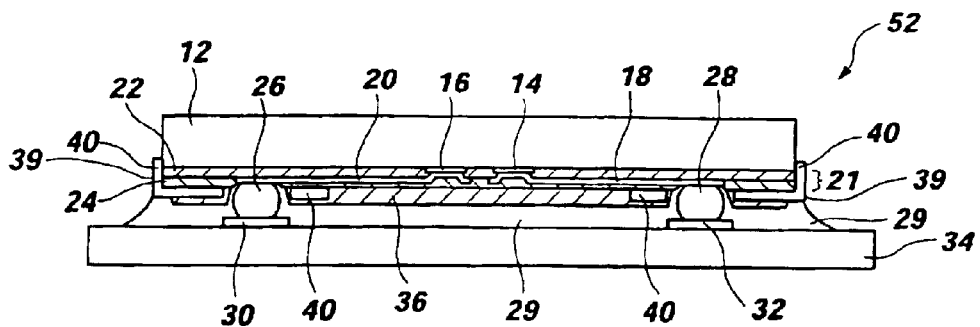
FIG. 12 is a side cross-sectional view of a flip chip assembly of the present invention having a dielectric underfill between the semiconductor die and substrate wherein the semiconductor die includes an electrically resistive heating circuit on the redistribution layer of the semiconductor die that extends to a peripheral surface of the semiconductor die and may be energized therethrough, the semiconductor die also having a dielectric layer that substantially covers the electrically resistive heating circuit.

FIG. 12 shows an alternate flip chip removal schematic embodiment of the present invention wherein flip chip 52 has been attached to substrate 34 by conventional reflow or by way of electrically resistive heating circuit 40 located on the redistribution layer 21 of flip chip 52. Removal of flip chip 52 may be accomplished by energizing the electrically resistive heating circuit 40 extending at least partially onto a peripheral surface 39 of the flip chip 52. This allows for an electrical connection to be made on a peripheral surface 39 of the flip chip 52 in order to energize the electrically resistive heating circuit 40 directly, and thereby attach or detach the flip chip 52 to or from substrate 34, respectively. To remove flip chip 52 from substrate 34, dielectric underfill 29 and discrete conductive elements 26, and 28 releasably respond to heating via electrically resistive heating circuit 40 by softening or melting to allow the flip chip 52 to be removed from the substrate 34. After removal, a solvent may be applied to remove any remaining dielectric underfill 29 from the substrate. Further, another flip chip 52' may be installed by energizing the electrically resistive heating circuit 40 in order to bond discrete conductive elements 26 and 28 to substrate terminal pads 30 and 32, respectively.

Figure 13A:
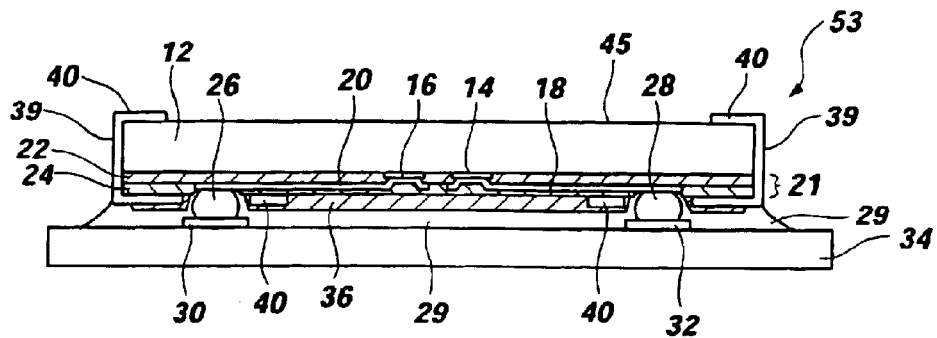
FIG. 13A is a side cross-sectional view of a flip chip assembly of the present invention having a dielectric underfill between the semiconductor die and substrate wherein the semiconductor die includes an electrically resistive heating circuit on the redistribution layer of the semiconductor die that extends to a peripheral and top surface of the semiconductor die and may be energized therethrough, the semiconductor die also having a dielectric layer that substantially covers the electrically resistive heating circuit.

FIG. 13A shows another embodiment of an exemplary flip chip removal schematic embodiment of the present invention. Flip chip 53 includes semiconductor die 12 with a redistribution layer 21 and also having an electrically resistive heating circuit 40 that extends at least partially onto a peripheral surface 39 and top surface 45 of the flip chip 53. This allows for an electrical connection to be made on a peripheral surface 39 or top surface 45 of the flip chip 53 in order to energize the electrically resistive heating circuit 40 and thereby attach or detach the flip chip 53 to or from substrate 34, respectively. To remove flip chip 53 from substrate 34, dielectric underfill 29 releasably responds to heating from electrically resistive heating circuit 40, while discrete conductive elements 26 and 28 melt to allow the flip chip 53 to be removed from the substrate 34.

Figure 13B:
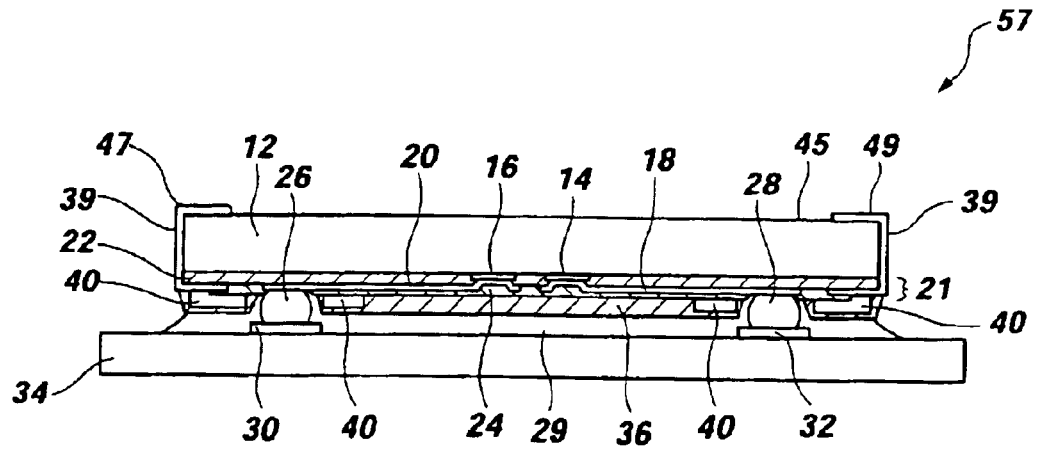
FIG. 13B is a side cross-sectional view of a flip chip assembly of the present invention having a dielectric underfill between the semiconductor die and substrate wherein the semiconductor die includes an electrically resistive heating circuit on the redistribution layer of the semiconductor die, wherein a conductive trace of the redistribution layer is connected to the electrically resistive heating circuit and extends to a peripheral and top surface of the semiconductor die and may be energized therethrough, a dielectric layer at least partially covering the electrically resistive heating circuit.

FIG. 13B shows a similar embodiment of an exemplary flip chip removal schematic embodiment shown in FIG. 12A. Flip chip 57 includes semiconductor die 12 with a redistribution layer 21 and also having low resistance conductive traces 47 and 49 that extend at least partially onto a peripheral surface 39 and top surface 45 of the flip chip 57. This allows for an electrical connection to be made on a peripheral surface 39 or top surface 45 of the flip chip 57 via redistribution layer conductive traces 47 and 49 in order to energize the electrically resistive heating circuit 40, and thereby attach or detach the flip chip 57 to or from substrate 34, respectively. To remove flip chip 57 from substrate 34, dielectric underfill 29 as well as electrical connection elements 26, and 28 releasably respond to heating from electrically resistive heating circuit 40, to allow the flip chip 57 to be removed from the substrate 34. It may be advantageous to utilize low resistance conductive traces 47 and 49 on a peripheral surface 39 or top surface 45 (instead of electrically resistive heating circuit material) so as to avoid heating the peripheral surface 39 and top surface 45 of the flip chip 57.

Figure 14A:
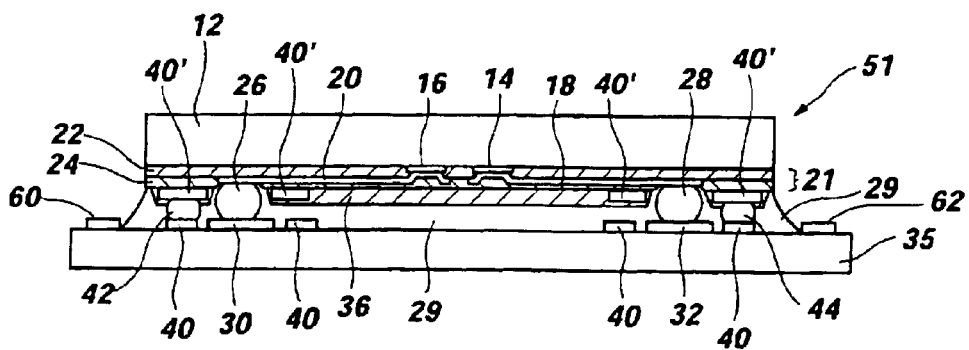
FIG. 14A is a side cross-sectional view of a flip chip assembly of the present invention having a dielectric underfill between the semiconductor die and substrate wherein the semiconductor die and the carrier substrate each include an electrically resistive heating circuit, both energized via terminal pads on the substrate, the semiconductor die also having a dielectric layer that substantially covers the electrically resistive heating circuit on the semiconductor die.

FIG. 14A shows a different embodiment of an exemplary flip chip removal schematic wherein electrically resistive heating circuit 40 is located on the substrate 35 and electrically resistive heating circuit 40' is located on the redistribution layer 21 of the flip chip 51. As noted above in reference to FIG. 9, many alternatives exist for configuring the operation of flip chips and substrates with electrically resistive heating circuits. Generally, substrate connection pads 60 and 62 supply power to electrically resistive heating circuits 40 and 40'. However, as shown in FIGS. 3B and 3D, heating circuits may be separated on the semiconductor die or substrate; thus additional electrical connections may exist to power heating circuits in different configurations.

In order to remove flip chip 51 from substrate 35, sufficient heat must be applied via electrically resistive heating circuits 40 and 40' to permit detaching discrete conductive elements 26 and 28 from their associated flip chip bond pads or associated substrate terminal pads. The substrate and flip chip may be compressed together under force to electrically connect connection pads to electrical connection elements in order to energize a flip chip electrically resistive heating circuit. Further, sufficient heating via electrically resistive heating circuits 40 and 40' to reduce or eliminate fixative characteristics of the dielectric underfill 29 between the flip chip 51 and the substrate 35, thus allowing removal of the flip chip 51, must be supplied if dielectric underfill 29 is used. More specifically, the dielectric underfill may soften, melt, degrade, evaporate, oxidize, or otherwise be modified with respect to its fixative properties to allow for removal of a flip chip from a substrate. Alternatively, dielectric underfill may be at least partially removed via solvents prior to heating the substrate and/or flip chip, if desired.

After removal of flip chip 51, remaining dielectric underfill 29 as well as any remaining portions of discrete conductive elements 26 and 28 may be removed to provide a relatively clean surface and terminal pads 30 and 32 on substrate 35 on which to bond another flip chip 51. Similar to the flip chip installation schematic embodiment shown in FIG. 9 and described hereinabove, electrically resistive heating circuits 40 and 40' may be energized individually and/or in combination to effect electrical attachment of another flip chip 51' (not shown) to the substrate 35.

Figure 14B:
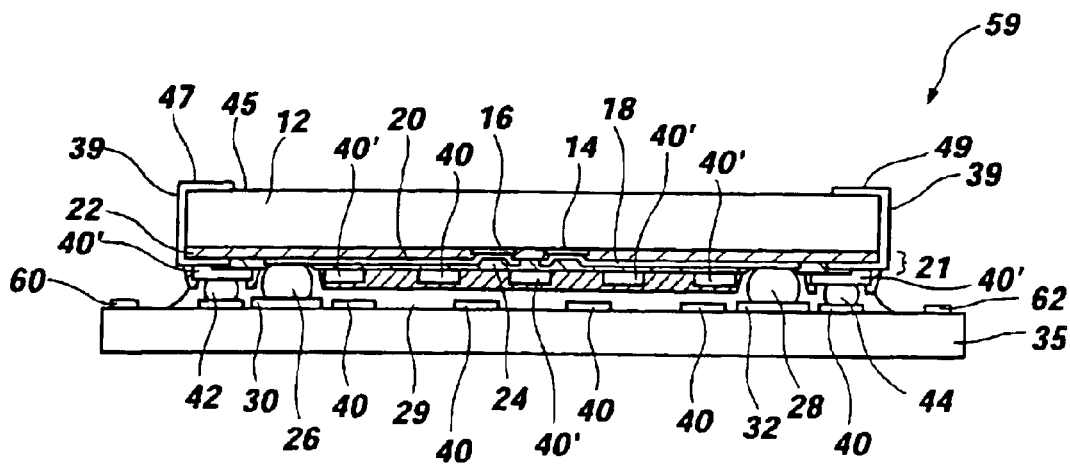
FIG. 14B a side cross-sectional view of a flip chip assembly of the present invention having a dielectric underfill between the semiconductor die and substrate wherein the semiconductor die includes an electrically resistive heating circuit on the substrate and on the redistribution layer of the semiconductor die, both electrically resistive heating circuits extending along the respective lateral surfaces of the substrate and semiconductor die, wherein a conductive trace of the redistribution layer is connected to the electrically resistive heating circuit and extends to a peripheral and top surface of the semiconductor die and may be energized therethrough, a dielectric layer at least partially covering the electrically resistive heating circuit.

Moving to FIG. 14B, an exemplary flip chip removal schematic embodiment is shown wherein flip chip 59 includes semiconductor die 12 and redistribution layer 21 and also low resistance conductive traces 47 and 49 that extend at least partially onto a peripheral surface 39 and top surface 45 of the flip chip 59. This allows for an electrical connection to be made on a peripheral surface 39 or top surface 45 of the flip chip 59 via low resistance conductive traces 47 and 49 in order to energize the electrically resistive heating circuit 40' and/or 40, and thereby detach the flip chip 59 from substrate 35. Dielectric underfill 29 as well as discrete conductive elements 26 and 28 releasably respond to heating from electrically resistive heating circuit 40, to allow the flip chip 59 to be removed from the substrate 35. It may be advantageous to utilize low resistance conductive traces 47 and 49 (instead of electrically resistive heating circuit material) on a peripheral surface 39 or top surface 45, as well as other areas, so as to avoid heating surfaces of the flip chip 59 unnecessarily. Alternatively, connection pads 60 and 62 may also be used to energize electrically resistive heating circuit 40 and/or 40', individually or in combination.

Also, electrically resistive heating circuit 40 is located along the plane of the substrate surface to provide an appropriate heating configuration to remove or install flip chip on 59 substrate 35, respectively. Similarly, electrically resistive heating circuit 40' is located along the plane of the redistribution layer 21. Such a configuration may more evenly heat the dielectric underfill 29, thus facilitating removal of the flip chip 59 from the substrate 35. Also, the configuration of electrically resistive heating circuits 40 and 40' may be similar to the configuration shown in FIG. 3D, discussed above.

Figure 15:
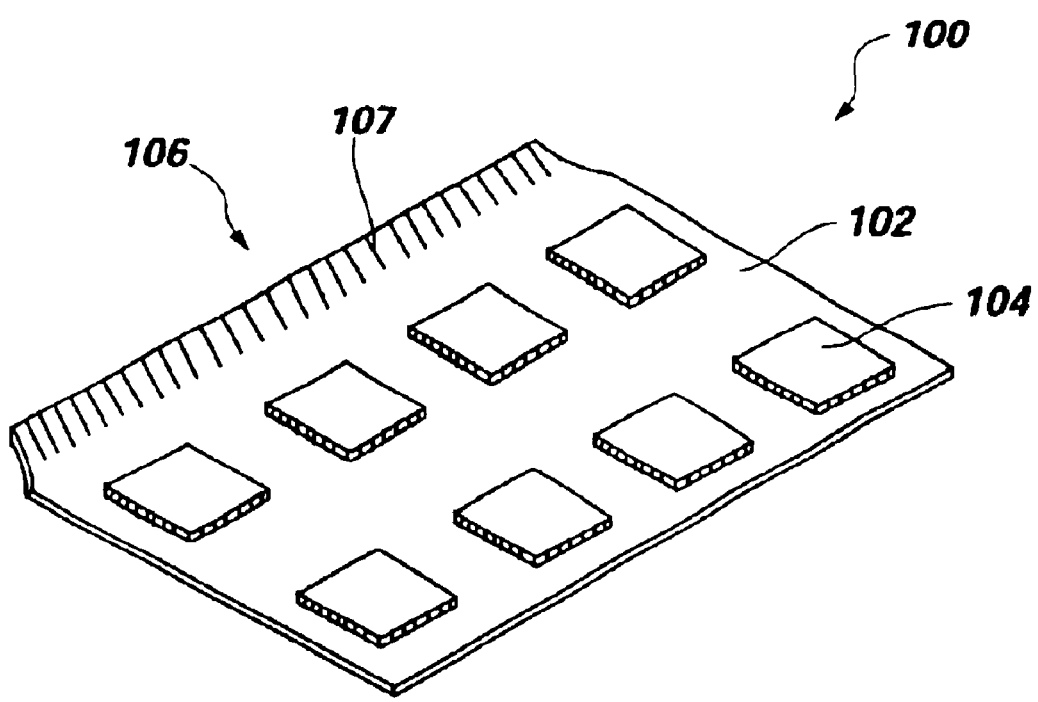
FIG. 15 shows a perspective schematic view of an MCM configured according to the present invention.

FIG. 15 shows a perspective schematic of an exemplary MCM 100 of the present invention having a plurality of semiconductor dice 104 with redistribution layers (not shown) wherein any individual semiconductor die 104 may be removed or installed via a resistive heating circuit configured on the semiconductor die 104, the substrate 102, or both the semiconductor die 104 and the substrate 102. The MCM 100 is shown generally as a memory module, with a connection side 106 having conductive contacts 107 that electrically connect through traces on or within substrate 102 to each semiconductor die 104 in the MCM 100, as known in the art. As is conventional practice, semiconductor dice 104 may be installed on one side of substrate 102 or onto both sides of substrate 102.

Concerning replacement of a semiconductor die 104 of MCM 100, many alternatives are possible, as discussed with respect to the aforementioned embodiments of the present invention. First, an electrically resistive heating circuit may be affixed to one or more semiconductor dice 104, as shown in FIGS. 8, 10, 11, 14A, and 14B, and energized via terminal pads on the substrate 102 or conductive contacts 107 on connection side 106. Alternatively, an electrically resistive heating circuit located on the semiconductor die may be energized via a conductive trace that extends to a peripheral surface 39 or top surface 45 of each semiconductor die, as shown in FIGS. 6, 7A–7B, 12, 13A–13B, and 14A–14B. Second, an electrically resistive heating circuit may be located on the substrate 102, as shown in FIGS. 9, 10, 14A, and 14B, and configured to allow for removal of a semiconductor die 104 from the substrate 102 and energized via terminal pads on the substrate 102 or conductive contacts 107 on connection end 106. Moreover, an electrically resistive heating circuit (not shown) located on the substrate 102 may be energized via a conductive trace that extends to a peripheral surface 39 or top surface 45 of the semiconductor die 104, as shown in FIG. 14B. Third, electrically resistive heating circuits may be located on both the semiconductor dice 104 and the substrate 102 to allow for removal of one or more semiconductor dice 104 from the substrate, as shown in FIGS. 10, 14A, and 14B. Electrically resistive heating circuits may be energized by way of any of the aforementioned configurations as well as other configurations known in the art.

Similarly, installation of a replacement semiconductor die 104 may be effected by energizing the electrically resistive heating circuit or circuits and positioning the replacement semiconductor die 104 so as to create an electrical connection between the bond pads of the semiconductor die (not shown) and the substrate terminal pads (not shown). Cleaning of the substrate 102 terminal (not shown), removal of residual electrical connection material of the discrete conductive elements, such as solder, as well as depositing solder, solder paste, or flux on the substrate terminal pads or replacement semiconductor die 104 may be desirable prior to energizing the electrically resistive heating circuit and creating the electrical connections between the replacement semiconductor die 104 and the substrate 102.

It will be recognized by those of ordinary skill in the art that the present invention may be effectively practiced using conventional tin/lead solder conductive bumps, which exhibit a reflow temperature of, for example, 230° C. One may employ a commercially available thermoplastic dielectric underfill having a melting point at about 300° C. or above for optional use in the practice of the present invention. Such temperatures pose no significant hazard to the semiconductor die, as it may be conventionally heated to 380° C. to effect a cure of, for example, a polyimide passivation layer without damage. Further, an agent may be added to the dielectric or coated on a surface of the semiconductor die or substrate to facilitate chemical breakage of the dielectric underfill bond when heated.

Although the foregoing description contains many specifics, these should not be construed as limiting the scope of the present invention, but merely as providing illustrations of certain exemplary embodiments. Similarly, other embodiments of the invention may be devised which do not depart from the spirit or scope of the present invention. Features from different embodiments may be employed in combination with one another. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor die assembly, comprising:
    a semiconductor die;
    a substrate configured with terminal pads connected to the semiconductor die via a plurality of discrete conductive elements extending substantially transversely between the semiconductor die and the substrate;
    an electrically resistive heating circuit disposed on an active surface of the semiconductor die comprising at least one resistive heat-generating region located proximate to the plurality of discrete conductive elements, the plurality of discrete conductive elements being detachable in response to energizing the electrically resistive heating circuit; and
    a plurality of electrical connection elements connected to the electrically resistive heating circuit having a different melting point than a melting point of the plurality of discrete conductive elements and extending transversely between the semiconductor die and the substrate.

2. The semiconductor die assembly of claim 1, wherein the electrically resistive heating circuit is electrically connected to at least one substrate connection pad on the substrate configured for contact by a power source.

3. The semiconductor die assembly of claim 1, wherein the electrically resistive heating circuit further comprises at least one electrically conductive substantially nonheat-generating region.

4. The semiconductor die assembly of claim 1, wherein the electrically resistive heating circuit is electrically connected to a conductive trace that extends onto a peripheral surface of the semiconductor die.

5. The semiconductor die assembly of claim 4, wherein the conductive trace further extends onto a top surface of the semiconductor die.

6. A semiconductor die assembly, comprising:
a semiconductor die;
a substrate configured with terminal pads connected to the semiconductor die via a plurality of discrete conductive elements extending substantially transversely between the semiconductor die and the substrate; and
an electrically resistive heating circuit disposed on an active surface of the semiconductor die comprising at least one resistive heat-generating region located proximate to the plurality of discrete conductive elements, the plurality of discrete conductive elements being detachable in response to energizing the electrically resistive heating circuit, wherein the electrically resistive heating circuit is electrically connected to a conductive trace that extends onto a peripheral surface of the semiconductor die.

7. The semiconductor die assembly of claim 6, wherein the conductive trace extends from a redistribution layer wherein the electrically resistive heating circuit is located.

8. The semiconductor die assembly of claim 6, wherein the conductive trace further extends onto a top surface of the semiconductor die.

9. A method of attaching a semiconductor die to a substrate, comprising:
providing a semiconductor die having a plurality of bond pads on an active surface thereof;
providing a substrate having a plurality of terminal pads on a surface thereof;
providing a plurality of discrete conductive elements extending substantially transversely between the semiconductor die and the substrate and in contact with bond pads of the semiconductor die and terminal pads of the substrate;
providing an electrically resistive heating circuit disposed on the active surface of the semiconductor die proximate to the plurality of discrete conductive elements;
providing a plurality of electrical connection elements extending substantially transversely between the semiconductor die and the substrate and in contact with the electrically resistive heating circuit, the electrical connection elements having a different melting point than a melting point of the discrete conductive elements; and
energizing the electrically resistive heating circuit to cause the discrete conductive elements to establish a bond between the bond pads and the terminal pads.

10. The method of claim 9, wherein energizing the electrically resistive heating circuit comprises energizing the electrically resistive heating circuit by contacting at least one substrate connection pad on the substrate with a power source.

11. The method of claim 9, wherein providing an electrically resistive heating circuit comprises configuring the electrically resistive heating circuit to include at least one electrically conductive substantially nonheat-generating region.

12. The method of claim 9, wherein energizing the electrically resistive heating circuit comprises energizing the electrically resistive heating circuit such that the discrete conductive elements form electrical connections between the semiconductor die bond pads and the substrate terminal pads.

13. The method of claim 9, further comprising measuring a force or component position indicating that the plurality of discrete conductive elements has reduced rigidity responsive to heat generated by the electrically resistive heating circuit.

14. The method of claim 9, further comprising measuring a change in a state of the plurality of electrical connection elements responsive to heat generated by the electrically resistive heating circuit, to indicate that the plurality of discrete conductive elements has established the bond.

15. The method of claim 9, wherein providing the electrically resistive heating circuit comprises forming the electrically resistive heating circuit within a redistribution layer on the active surface of the semiconductor die.

16. The method of claim 9, wherein energizing the electrically resistive heating circuit comprises energizing the electrically resistive heating circuit through a conductive trace that extends onto a peripheral surface of the semiconductor die.

17. The method of claim 9, wherein energizing the electrically resistive heating circuit comprises energizing the electrically resistive heating circuit through a conductive trace that extends onto a top surface of the semiconductor die.

18. A method of attaching a semiconductor die to a substrate, comprising:
providing a semiconductor die having a plurality of bond pads on an active surface thereof;
providing a substrate having a plurality of terminal pads on a surface thereof;
providing a plurality of discrete conductive elements extending substantially transversely between the semiconductor die and the substrate and in contact with bond pads of the semiconductor die and terminal pads of the substrate;
providing an electrically resistive beating circuit disposed on the active surface of the semiconductor die proximate to the plurality of discrete conductive elements;
providing at least another electrically resistive heating circuit disposed on the substrate proximate to the plurality of discrete conductive elements;
electrically connecting the electrically resistive heating circuit and the at least another electrically resistive heating circuit through discrete conductive elements of the plurality of discrete conductive elements in one of a parallel electrical wiring arrangement and a series electrical wiring arrangement: and
energizing the electrically resistive heating circuit and the at least another electrically resistive heating circuit to cause the discrete conductive elements to establish a bond between the bond pads and the terminal pads.

19. A method of attaching a semiconductor die to a substrate, comprising:
providing a semiconductor die having a plurality of bond pads on an active surface thereof;
providing a substrate having a plurality of terminal pads on a surface thereof;
providing a plurality of discrete conductive elements extending substantially transversely between the semiconductor die and the substrate and in contact with bond pads of the semiconductor die and terminal pads of the substrate;

providing an electrically resistive heating circuit disposed on the active surface of the semiconductor die proximate to the plurality of discrete conductive elements;

providing a conductive trace electrically connected to the electrically resistive heating circuit that extends onto a peripheral surface of the semiconductor die; and energizing the electrically resistive heating circuit by contacting the conductive trace with a power source to cause the discrete conductive elements to establish a bond between the bond pads and the terminal pads.

20. The method of claim 19, wherein providing a conductive trace comprises forming at least a portion of the conductive trace concurrently with the electrically resistive heating circuit.

21. The method of claim 19, wherein providing the conductive trace electrically connected to the electrically resistive heating circuit that extends onto a top surface of the semiconductor die.

22. A method of removing a semiconductor die from a substrate, comprising:

providing a semiconductor die having a plurality of bond pads;

providing a substrate having a plurality of terminal pads;

wherein the plurality of bond pads are respectively bonded to the plurality of terminal pads through a plurality of discrete conductive elements extending substantially transversely between the semiconductor die and the substrate;

providing an electrically resistive heating circuit disposed on the active surface of the semiconductor die proximate to the discrete conductive elements;

providing a plurality of electrical connection elements extending substantially transversely between the semiconductor die and the substrate and in contact with the electrically resistive heating circuit, the electrical connection elements having a different melting point than a melting point of the discrete conductive elements;

energizing the electrically resistive heating circuit to cause the discrete conductive elements to relax the bond between the bond pads and associated terminal pads sufficiently to release the semiconductor die from the substrate; and detaching the semiconductor die from the substrate.

23. The method of claim 22, wherein energizing the electrically resistive heating circuit comprises energizing the electrically resistive heating circuit to cause the discrete conductive elements to at least soften.

24. The method of claim 23, wherein energizing the electrically resistive heating circuit comprises energizing the electrically resistive heating circuit for a predetermined amount of time.

25. The method of claim 23, wherein energizing the electrically resistive heating circuit comprises energizing the electrically resistive heating circuit to supply a predetermined amount of thermal energy to the discrete conductive elements.

26. The method of claim 22, further comprising measuring a force or component position indicating that the plurality of discrete conductive elements has a reduced rigidity.

27. The method of claim 22, further comprising measuring a change in state of the plurality of electrical connection elements responsive to heat generated by the electrically resistive heating circuit to indicate that the plurality of discrete conductive elements have substantially released the bond between the bond pads and the associated terminal pads.

28. The method of claim 22, wherein energizing the electrically resistive heating circuit comprises energizing the electrically resistive heating circuit by contacting at least one substrate connection pad on the substrate with a power source.

29. The method of claim 22, wherein providing an electrically resistive heating circuit comprises configuring the electrically resistive heating circuit to include at least one electrically conductive, substantially nonheat-generating region.

30. The method of claim 22, wherein providing an electrically resistive heating circuit comprises forming the electrically resistive heating circuit as part of a redistribution layer on the active surface of the semiconductor die.

31. The method of claim 22, wherein energizing the electrically resistive heating circuit comprises energizing the electrically resistive heating circuit through a conductive trace that extends onto a peripheral surface of the semiconductor die.

32. The method of claim 22, wherein energizing the electrically resistive heating circuit comprises energizing the electrically resistive heating circuit through a conductive trace that extends onto a top surface of the semiconductor die.

33. A method of removing a semiconductor die from a substrate, comprising:

providing a semiconductor die having a plurality of bond pads;

providing a substrate having a plurality of terminal pads;

wherein the plurality of bond pads are respectively bonded to the plurality of terminal pads through a plurality of discrete conductive elements extending substantially transversely between the semiconductor die and the substrate;

providing an electrically resistive heating circuit disposed on the active surface of the semiconductor die proximate to the discrete conductive elements;

providing at least another electrically resistive heating circuit disposed on the substrate proximate to the plurality of discrete conductive elements;

electrically connecting the electrically resistive heating circuit and the at least another electrically resistive heating circuit through discrete conductive elements of the plurality of discrete conductive elements in one of a parallel electrical wiring arrangement and a series electrical wiring arrangement:

energizing the electrically resistive heating circuit and the at least another electrically resistive heating circuit to cause the discrete conductive elements to relax the bond between the bond pads and associated terminal pads sufficiently to release the semiconductor die from the substrate; and detaching the semiconductor die from the substrate.

34. A method of removing a semiconductor die from a substrate, comprising:

providing a semiconductor die having a plurality of bond pads;

providing a substrate having a plurality of terminal pads;

wherein the plurality of bond pads are respectively bonded to the plurality of terminal pads through a plurality of discrete conductive elements extending substantially transversely between the semiconductor die and the substrate;

providing an electrically resistive heating circuit disposed on an active surface of the semiconductor die proximate to the discrete conductive elements;

providing a conductive trace connected to the electrically resistive heating circuit that extends onto a peripheral surface of the semiconductor die;

energizing the electrically resistive heating circuit by contacting the conductive trace with a power source to cause the discrete conductive elements to relax the bond between the bond pads and associated terminal pads sufficiently to release the semiconductor die from the substrate; and detaching the semiconductor die from the substrate.

35. The method of claim 34, wherein providing a conductive trace comprises forming at least a portion of the conductive trace concurrently with the electrically resistive heating circuit.

36. The method of claim 34, wherein providing the conductive trace connected to the electrically resistive heating circuit further comprises providing a conductive trace that extends onto a top surface of the semiconductor die.

37. A method of replacing a semiconductor die secured to a substrate, comprising:

providing a substrate having a plurality of terminal pads;

providing a first semiconductor die electrically connected to the substrate by a plurality of discrete conductive elements extending substantially transversely between the first semiconductor die and the substrate and having a bond to both;

providing an electrically resistive heating circuit disposed on an active surface of the first semiconductor die adjacent the discrete conductive elements;

providing a plurality of electrical connection elements extending substantially transversely between the first semiconductor die and the substrate and in contact with the electrically resistive heating circuit, the electrical connection elements having a different melting point than a melting point of the discrete conductive elements;

energizing the electrically resistive heating circuit to cause the discrete conductive elements to release the bond;

removing the first semiconductor die from the substrate;

providing a second semiconductor die having a plurality of discrete conductive elements extending substantially transversely therefrom;

positioning the second semiconductor die and substrate so that the plurality of discrete conductive elements of the second semiconductor die are aligned with the terminal pads of the substrate; and heating the discrete conductive elements of the second semiconductor die to establish a bond with the terminal pads.

38. The method of claim 37, wherein energizing the electrically resistive heating circuit comprises energizing the electrically resistive heating circuit to cause the discrete conductive elements of the first semiconductor die to at least soften.

39. The method of claim 38, wherein energizing the electrically resistive heating circuit comprises energizing the electrically resistive heating circuit for a predetermined amount of time.

40. The method of claim 39, wherein energizing the electrically resistive heating circuit comprises energizing the electrically resistive heating circuit to supply a predetermined amount of thermal energy to the discrete conductive elements of the first semiconductor die.

41. The method of claim 37, further comprising measuring a force or component position indicating that the plurality of discrete conductive elements has a reduced rigidity responsive to energizing of the electrically resistive heating circuit.

42. The method of claim 37, further comprising measuring a change in state of the plurality of electrical connection elements responsive to heat generated by the electrically resistive heating circuit to indicate that the plurality of discrete conductive elements of the first semiconductor die has substantially released the bond.

43. The method of claim 37, wherein energizing the electrically resistive heating circuit comprises energizing the electrically resistive heating circuit by contacting at least one substrate connection pad on the substrate with a power source.

44. The method of claim 37, wherein providing an electrically resistive heating circuit comprises configuring the electrically resistive heating circuit to include at least one electrically conductive, substantially nonheat-generating region.

45. The method of claim 37, wherein providing an electrically resistive heating circuit comprises forming the electrically resistive heating circuit as part of a redistribution layer on the active surface of the first semiconductor die.

46. The method of claim 37, wherein energizing the electrically resistive heating circuit comprises energizing the electrically resistive heating circuit through a conductive trace that extends onto a peripheral surface of the first semiconductor die.

47. The method of claim 37, wherein energizing the electrically resistive heating circuit comprises energizing the electrically resistive heating circuit through a conductive trace that extends onto a top surface of the first semiconductor die.

48. A method of replacing a semiconductor die secured to a substrate, comprising:

providing a substrate having a plurality of terminal pads;

providing a first semiconductor die electrically connected to the substrate by a plurality of discrete conductive elements extending substantially transversely between the first semiconductor die and the substrate and having a bond to both;

providing an electrically resistive heating circuit disposed on an active surface of the first semiconductor die adjacent the discrete conductive elements;

providing a conductive trace connected to the electrically resistive heating circuit that extends onto a peripheral surface of the first semiconductor die;

energizing the electrically resistive heating circuit by contacting the conductive trace with a power source to cause the discrete conductive elements to release the bond;

removing the first semiconductor die from the substrate;

providing a second semiconductor die having a plurality of discrete conductive elements extending substantially transversely therefrom;

positioning the second semiconductor die and substrate so that the plurality of discrete conductive elements of the second semiconductor die are aligned with the terminal pads of the substrate; and heating the discrete conductive elements of the second semiconductor die to establish a bond with the terminal pads.

49. The method of claim 48, wherein providing a conductive trace comprises forming at least a portion of the conductive trace concurrently with the electrically resistive heating circuit.

50. The method of claim 48, wherein providing the conductive trace connected to the electrically resistive heating circuit further comprises providing a conductive trace that extends onto a top surface of the first semiconductor die.

51. A semiconductor die, comprising:
- a semiconductor die having a plurality of discrete conductive elements protruding substantially transversely from a surface thereof;
- an electrically resistive heating circuit located on the surface of the semiconductor die, the electrically resistive heating circuit comprising at least one electrically resistive, heat-generating region adjacent the plurality of discrete conductive elements and configured to cause the plurality of discrete conductive elements to at least soften upon energizing of the electrically resistive heating circuit; and
- at least one electrical connection element protruding substantially transversely from the surface of the semiconductor die and wherein the electrically resistive heating circuit is located and configured to at least soften the at least one electrical connection element at a different temperature than a temperature at which the discrete conductive elements at least soften.

52. The semiconductor die of claim 51, wherein the electrically resistive heating circuit further comprises at least one electrically conductive, substantially nonheat-generating region.

53. The semiconductor die of claim 51, wherein the electrically resistive heating circuit is substantially covered by a dielectric layer.

54. The semiconductor die of claim 51, wherein the electrically resistive heating circuit is configured to cause a dielectric underfill material adjacent the surface of the semiconductor die to at least soften.

55. A semiconductor die, comprising:
- a semiconductor die having a plurality of discrete conductive elements protruding substantially transversely from a surface thereof; and
- an electrically resistive heating circuit located on the surface of the semiconductor die, the electrically resistive heating circuit comprising at least one electrically resistive, heat-generating region adjacent the plurality of discrete conductive elements and configured to cause the plurality of discrete conductive elements to at least soften upon energizing of the electrically resistive heating circuit, wherein the electrically resistive heating circuit extends onto a peripheral surface of the semiconductor die.

56. The semiconductor die of claim 55, wherein the electrically resistive heating circuit further extends onto a top surface of the semiconductor die.

* * * * *

UNITED STATES PATENT AND TRADEMARK OFFICE
CERTIFICATE OF CORRECTION

PATENT NO. : 6,911,624 B2  Page 1 of 1
APPLICATION NO. : 10/226896
DATED : June 28, 2005
INVENTOR(S) : Koopmans It is certified that error appears in the above-identified patent and that said Letters Patent is hereby corrected as shown below:

In column 18, line 42, in Claim 18, delete "beating" and insert -- heating --, therefor.

In column 18, line 53, in Claim 18, after "arrangement" delete ":" and insert -- ; --, therefor.

In column 20, line 49, in Claim 33, after "arrangement" delete ":" and insert -- ; --, therefor.

Signed and Sealed this

Twenty Second Day of April, 2008

JON W. DUDAS
*Director of the United States Patent and Trademark Office*